United States Patent
Lin et al.

(10) Patent No.: US 11,362,242 B2
(45) Date of Patent: Jun. 14, 2022

(54) LIGHT-EMITTING DEVICE

(71) Applicant: Lextar Electronics Corporation, Hsinchu (TW)

(72) Inventors: Chih-Hao Lin, Hsinchu (TW); Chang-Han Chen, Hsinchu (TW); Chun-Peng Lin, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 51 days.

(21) Appl. No.: 16/736,830

(22) Filed: Jan. 8, 2020

(65) Prior Publication Data
US 2020/0243734 A1  Jul. 30, 2020

(30) Foreign Application Priority Data
Jan. 24, 2019  (CN) .......................... 201910068627.3

(51) Int. Cl.
*H01L 33/58* (2010.01)
*H01L 33/56* (2010.01)
*H01L 33/54* (2010.01)

(52) U.S. Cl.
CPC .............. *H01L 33/58* (2013.01); *H01L 33/54* (2013.01); *H01L 33/56* (2013.01)

(58) Field of Classification Search
CPC ......... H01L 33/58; H01L 33/56; H01L 33/54; H01L 2251/5369
See application file for complete search history.

(56) References Cited

U.S. PATENT DOCUMENTS

| 8,772,431 B2 | 7/2014 | Takei et al. |
| 9,166,126 B2 | 10/2015 | Donofrio et al. |
| 9,236,502 B2 | 1/2016 | Tischler |
| 9,343,443 B2 | 5/2016 | Tischler et al. |
| 9,450,157 B2 | 9/2016 | Yamada et al. |
| 9,472,732 B2 | 10/2016 | Tischler |

(Continued)

FOREIGN PATENT DOCUMENTS

| CN | 204441329 U | 7/2015 |
| CN | 104813492 B | 5/2016 |

(Continued)

*Primary Examiner* — Jay C Chang
*Assistant Examiner* — Mikka Liu
(74) *Attorney, Agent, or Firm* — CKC & Partners Co., LLC

(57) ABSTRACT

A light-emitting device includes a panel substrate, a light-emitting chip, and a light extracting layer. The light-emitting chip is disposed on the panel substrate. The light extracting layer covers the light-emitting chip and the panel substrate, and the light extracting layer has a side portion. Taking the position where the edge of the light-emitting chip is in contact with the panel substrate as the origin, the side portion and the origin define a circle tangential to the surface of the side portion. The circle has a radius c which satisfies the following formula (1):

$$\frac{1}{40}H \leq c \leq H \quad (1)$$

where H is a height of the light-emitting chip. The light-emitting device disclosed herein has a light extracting layer having a very small thickness, and provides excellent light-emitting efficiency and lifetime of the light-emitting device.

11 Claims, 4 Drawing Sheets

(56) References Cited

U.S. PATENT DOCUMENTS

| | | | |
|---|---|---|---|
| 9,768,363 B2 | 9/2017 | Lee et al. | |
| 9,929,309 B2 | 3/2018 | Min et al. | |
| 2008/0303039 A1* | 12/2008 | Craford | H01L 33/62 257/89 |
| 2009/0278147 A1* | 11/2009 | Suzuki | H01L 33/56 257/98 |
| 2011/0315956 A1* | 12/2011 | Tischler | F21V 23/02 257/13 |
| 2013/0001623 A1* | 1/2013 | Wen | H01L 33/54 257/98 |
| 2017/0194538 A1* | 7/2017 | Chen | H01L 33/56 |

FOREIGN PATENT DOCUMENTS

| | | |
|---|---|---|
| CN | 106952991 A | 7/2017 |
| CN | 104701438 B | 11/2017 |
| TW | I245436 B | 12/2005 |
| TW | 200744234 A | 12/2007 |
| TW | 201041191 A1 | 11/2010 |
| TW | 201344979 A | 11/2013 |
| TW | 201403872 A | 1/2014 |
| TW | I435469 B | 4/2014 |
| TW | I462343 B | 11/2014 |
| TW | I521742 B | 2/2016 |
| TW | 201610086 A | 3/2016 |
| TW | 201637242 A | 10/2016 |
| TW | I568027 B | 1/2017 |
| TW | I624968 B | 5/2018 |
| TW | I636593 B | 9/2018 |

* cited by examiner

LIGHT-EMITTING DEVICE

CROSS-REFERENCE TO RELATED APPLICATION

This application claims priority to China Application No. 201910068627.3 Jan. 24, 2019, the entirety of which is incorporated herein by reference.

BACKGROUND

Field of Invention

The present disclosure is directed to a light-emitting device.

Description of Related Art

The deep ultraviolet light-emitting diode has advantages of low power consumption, long lifetime duration, no pollution, etc., and is widely used in technologies of ultraviolet disinfection. In a conventional package structure of a deep ultraviolet light-emitting diode, the deep ultraviolet light-emitting diode is disposed in a recess of a cup-shaped substrate, and is sealed by a cover plate made of quartz.

However, such a cup-shaped substrate requires a special manufacturing process, and the cover plate made of quartz is very expensive, so that the cost of such a package structure is high. In addition, the recess of the cup-shaped substrate is filled with air, and the light emitted from the deep ultraviolet light-emitting diode is prone to be totally reflected by the cover plate. As a result, the light extraction rate of the package structure is reduced.

In another conventional package structure of a deep ultraviolet light-emitting diode, a layer of organic material that covers the deep ultraviolet light-emitting diode is formed by a molding process. However, the organic material layer formed in this manner is too thick, so that the light emitted from the deep ultraviolet light-emitting diode is absorbed by the organic material layer, thereby reducing the light extraction efficiency. In addition, the organic material layer is prone to be degraded after absorbing ultraviolet light, and therefore the duration lifetime of the package structure is unfavorably affected. Accordingly, there is a need for a package structure of a deep ultraviolet light-emitting diode that can resolve the problems described above.

SUMMARY

According to embodiments of the present disclosure, a light-emitting device is provided. The light-emitting device includes a panel substrate, a light-emitting chip, and a light extracting layer. The light-emitting chip is disposed on the panel substrate. The light extracting layer covers the light-emitting chip and the panel substrate, and the light extracting layer has a side portion. Taking the position where the edge of the light-emitting chip is in contact with the panel substrate as an origin, the side portion and the origin define a circle tangential to the surface of the side portion. The circle has a radius c which satisfies the following formula (1):

$$\frac{1}{40}H \leq c \leq H \quad (1)$$

where H is a height of the light-emitting chip.

In an embodiment of the present disclosure, the light extracting layer has an intermediate portion, in which an upper surface of the light-emitting chip and an upper surface of the intermediate portion define a thickness of 10 to 200 µm.

In an embodiment of the present disclosure, the light extracting layer has an absorption coefficient of 0.3 to 0.00436 $cm^{-1}$ for light having a wavelength of 280 nm.

In an embodiment of the present disclosure, the light extracting layer is doped with a plurality of viscosity-adjusting particles, and the viscosity-adjusting particles includes ceramic, metal, glass, silicone, tetrafluoroethylene-perfluoropropene copolymer (PFA) or poly tetrafluoroethylene (PTFE).

In an embodiment of the present disclosure, a side portion of the light extracting layer extends outward from the edge of the light-emitting chip along the surface of the panel substrate, and the side portion gradually decreases in thickness outwards.

In an embodiment of the present disclosure, the light-emitting device further includes a blocking structure disposed on the panel substrate. The blocking structure is spaced apart from the light-emitting chip by a distance, and the distance is greater than a length of the light-emitting chip.

In an embodiment of the present disclosure, the blocking structure has a height, and the height of the blocking structure is ¼ to 1 fold of the height of the light-emitting chip.

In an embodiment of the present disclosure, the blocking structure comprises metal, ceramic or plastic.

In an embodiment of the present disclosure, the blocking structure comprises aluminum, gold, silver, silicon, or a combination thereof.

In an embodiment of the present disclosure, the blocking structure has a profile of a circle or a polygon in a plan view.

In an embodiment of the present disclosure, the light-emitting device further includes a glue-phobic layer disposed on the panel substrate. The glue-phobic layer is spaced apart from the light-emitting chip by a distance, and the distance is greater than a length of the light-emitting chip.

In an embodiment of the present disclosure, the glue-phobic layer comprises polytetrafluoroethylene.

It is to be understood that both the foregoing general description and the following detailed description are by examples, and are intended to provide further explanation of the present disclosure as claimed.

BRIEF DESCRIPTION OF THE DRAWINGS

The various aspects of the disclosure can be better understood from the following detailed description. It should be noted that, in accordance with the standard practice in the industry, various features are not drawn to scale. In fact, the dimensions of a plurality of features can be arbitrarily increased or decreased to clarify the discussion.

DETAILED DESCRIPTION

The following disclosure provides many different embodiments or examples for implementing different features of the present disclosure. Specific examples of components and permutations are described below to simplify the present disclosure. Of course, the examples are merely examples and are not intended to be limiting. For example, in the following description, the disclosure of the first feature being formed on or above the second feature includes an embodiment in which the first feature is in direct contact with the second feature, and may also include an embodiment in which the first feature is not in direct contact with the second feature.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
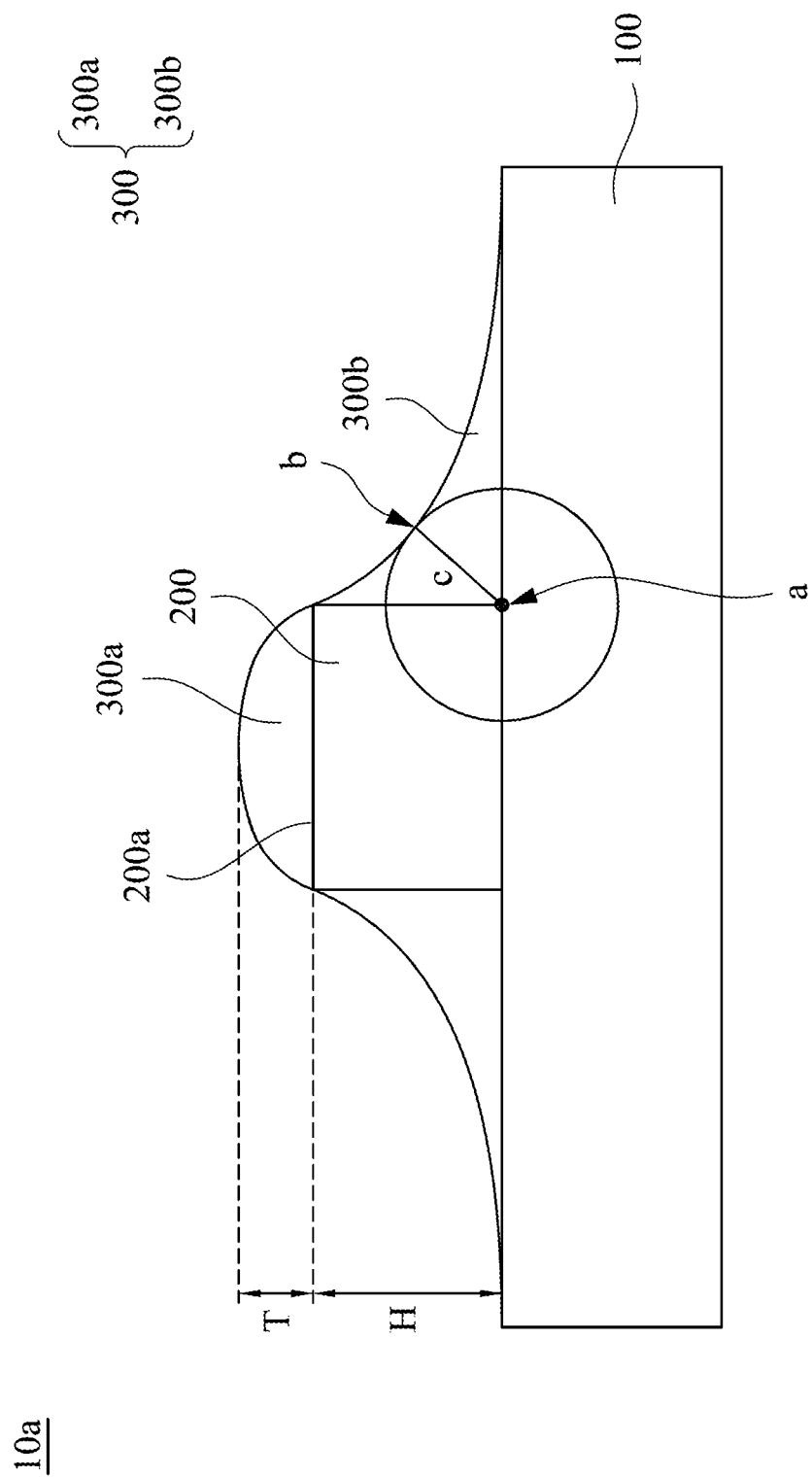
FIG. 1 is a cross-sectional view schematically illustrating a light-emitting device in accordance with some embodiments of the present disclosure.

Reference is made to FIG. 1. FIG. 1 is a cross-sectional view illustrating a light-emitting device 10a in accordance with some embodiments of the present disclosure. As shown in FIG. 1, the light-emitting device 10a includes a panel substrate 100, a light-emitting chip 200, and a light extracting layer 300.

The panel substrate 100 may comprise any suitable substrate. In some embodiments, the panel substrate 100 can be a transparent substrate or an opaque substrate. In some embodiments, the panel substrate 100 may be a flexible substrate. In other embodiments, the panel substrate 100 may be a rigid substrate. For example, the panel substrate 100 may be a sapphire substrate, a silicon substrate, a glass substrate, a printed circuit board, a metal substrate, a ceramic substrate or the like, but is not limited thereto.

The light-emitting chip 200 is disposed on the panel substrate 100. According to some embodiments of the present disclosure, the light-emitting chip 200 is a light-emitting chip capable of emitting deep ultraviolet light. For example, the light-emitting chip 200 may be a deep ultraviolet light-emitting diode, but is not limited thereto.

The light extracting layer 300 covers the light-emitting chip 200 and the panel substrate 100. Specifically, the light extracting layer 300 has an intermediate portion 300a and a side portion 300b. The intermediate portion 300a and the side portion 300b are adjoined together to form a continuous curved surface and completely cover the light-emitting chip 200. The intermediate portion 300a is located on the upper surface 200a of the light-emitting chip 200, and the side portion 300b of the light extracting layer 300 covers the sidewall of the light-emitting chip 200. More specifically, the side portion 300b extends outwards from the edge of the light-emitting chip 200 along the surface of the panel substrate, and the side portion 300b gradually decreases in thickness outwards. The light extracting layer 300 may comprise any suitable transparent glue. For example, in some embodiments, the light extracting layer 300 includes a silicone resin, an epoxy resin, or an acrylic adhesive, but is not limited thereto. In some embodiments, the light extracting layer 300 has an absorption coefficient of 0.3 to 0.00436 cm$^{-1}$ for light with a wavelength of 280 nm. In some embodiments, the light extracting layer 300 has a transmittance ranged from 50% to 99% for light with a wavelength of 280 nm.

As described above, while the organic material layer covering the deep ultraviolet light-emitting diode is too thick, the light extracting efficiency is lowered and the lifetime duration of the package structure is unfavorably affected. However, it should be understood that the light extracting layer 300 of the present disclosure is formed by spraying the material described above on the light-emitting chip 200 and the panel substrate 100. Therefore, it has an extremely thin thickness, and the light extracting efficiency and lifetime duration of the device are not affected.

Specifically, in some embodiments, the upper surface 200a of the light-emitting chip 200 and the upper surface of the intermediate portion 300a of the light extracting layer 300 define a thickness T of the intermediate portion 300a, and the thickness T is 10-200 μm. Further, taking the position where the edge of the light-emitting chip 200 is in contact with the panel substrate 100 as an origin "a", the side portion 300b of the light extracting layer 300 and the origin "a" define a circle tangential to the surface "b" of the side portion 300b. The circle has a radius "c" which satisfies the following formula (1):

$$\frac{1}{40}H \le c \le H; \quad (1)$$

wherein H is a height of the light-emitting chip 200.

More specifically, as shown in FIG. 1, the thickness of the intermediate portion 300a of the light extracting layer 300 is gradually thinned from the middle toward the edge to form a shape of a plano-convex lens. It should be understood that the shape of the plano-convex lens facilitates the light emitted from the light-emitting chip 200 to more easily be refracted into the air so that the light extracting efficiency is increased. Similarly, the surface of the side portion 300b of the light extracting layer 300 is recessed downward. The downward recessed side portion 300b also facilitates the light emitted from the sidewall of the light-emitting chip 200 to more easily be refracted into the air to further increase the light extracting efficiency.

In some embodiments, the light extracting layer 300 is doped with a plurality of viscosity-adjusting particles. In particular, in order to form the light extracting layer 300 with a thin thickness, the viscosity-adjusting particles may be added to the material for the spraying process. The viscosity-adjusting particles facilitate the material to more easily adhere to the upper surface and the sidewalls of the light-emitting device 10a, so that after curing, a thinner light extracting layer 300 is formed. In some embodiments, the viscosity-adjusting particles include ceramic, metal, glass, silicone, tetrafluoroethylene-perfluoropropylene copolymer (PFA) or polytetrafluoroethylene (PTFE), etc., but are not limited thereto.

Figure 2A:
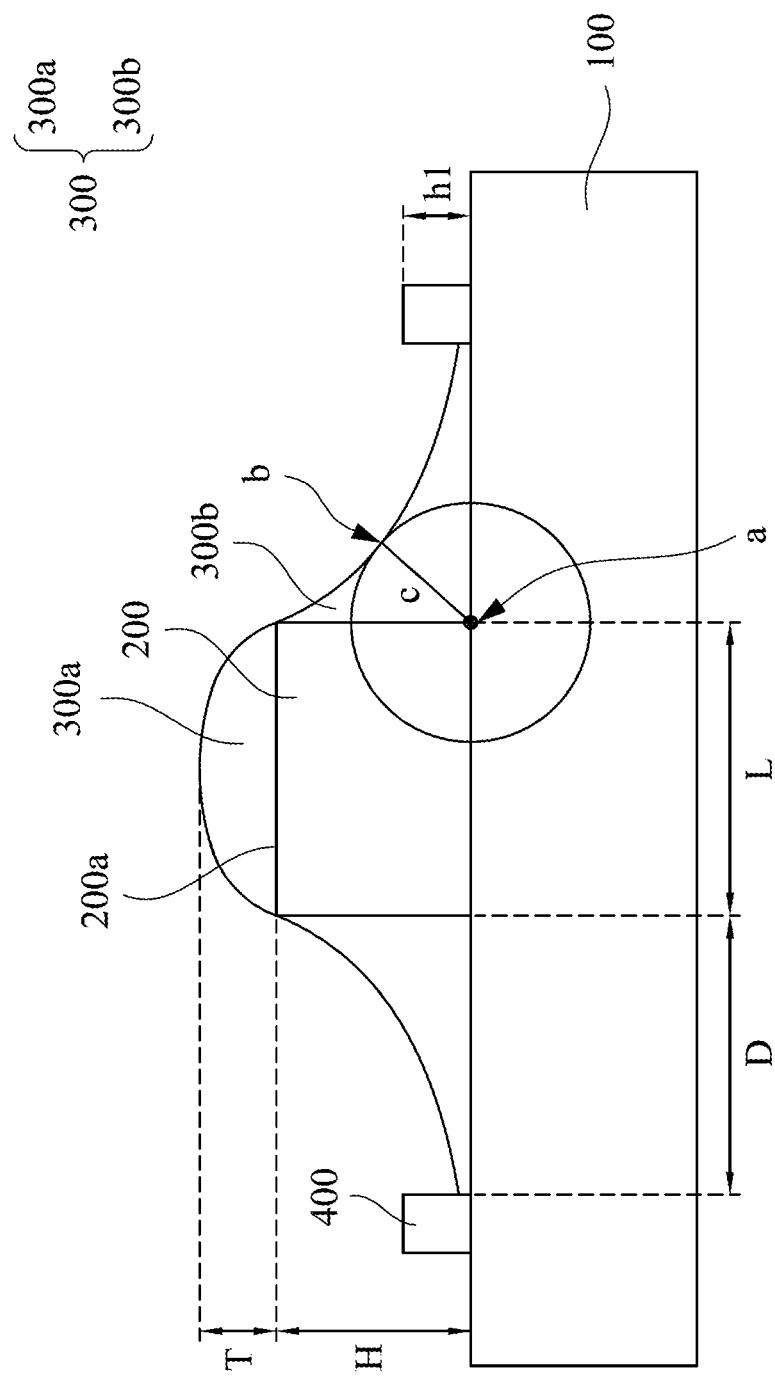
FIG. 2A is a cross-sectional view schematically illustrating a light-emitting device in accordance with some embodiments of the present disclosure.
Figure 2B:
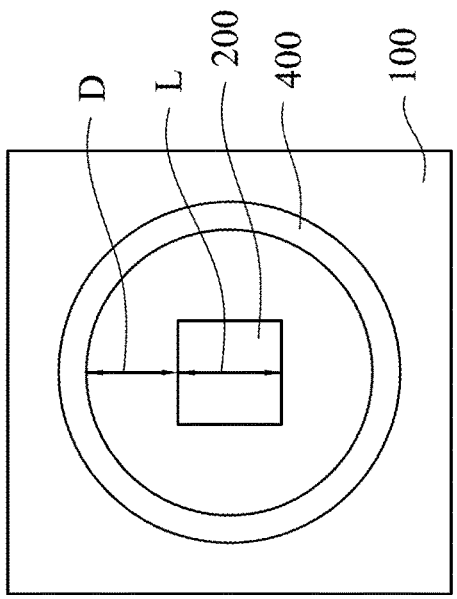
FIGS. 2B-2E are top views schematically illustrating a light-emitting device according to some embodiments of the present disclosure.

Reference is made to FIGS. 2A and 2B. FIG. 2A is a cross-sectional view illustrating a light-emitting device 10c in accordance with some embodiments of the present disclosure, and FIG. 2B depicts a plan view of the light-emitting device 10c. It is noted that, in FIG. 2A, the same or similar elements as those in FIG. 1 are given the same reference numerals, and the description thereof will be omitted. The light-emitting device 10c of FIG. 2A is similar to the light-emitting device 10a of FIG. 1, and the difference there between is in that the light-emitting device 10c further includes a blocking structure 400. The blocking structure 400 is disposed on the panel substrate 100 and is spaced apart from the light-emitting chip 200 by a distance D. Specifically, in order to prevent the formed light extracting layer 300 from occupying an excessively large area of the panel substrate 100 and affecting subsequent operations (such as test operations), the blocking structure 400 can be disposed on the panel substrate 100 (as shown in FIG. 2B) to surround the light-emitting chip 200. Accordingly, after the spraying process, the formed light extracting layer 300 can be positioned in the area surrounded by the blocking structure 400.

In some embodiments, the distance D is greater than the length L of the light-emitting chip 200. Moreover, in some embodiments, the height h1 of the blocking structure 400 is ¼-1 fold of the height H of the light-emitting chip 200. It should be understood that when the height h1 of the blocking structure 400 is less than ¼ fold of the height H of the light-emitting chip 200, the blocking effect is not good, and the formed light extracting layer 300 cannot be completely positioned (or limited) in the area surrounded by the blocking structure 400. When the height h1 of the blocking structure 400 is higher than that of the light-emitting chip 200, the light extracting efficiency of the device may be unfavorably affected. In some embodiments, the blocking structure 400 includes metal, ceramic or plastic, but is not limited thereto.

Figure 2C:
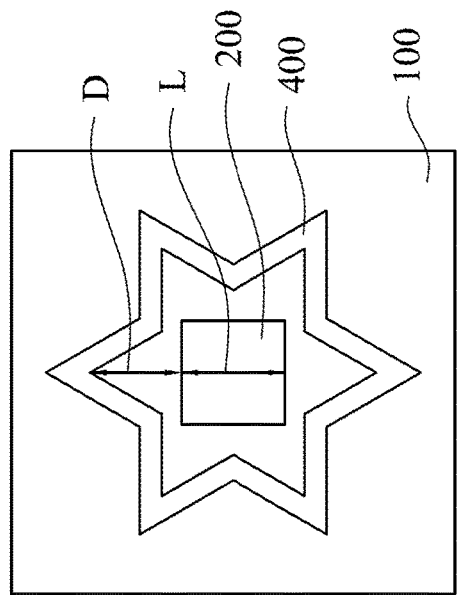
Figure 2D:
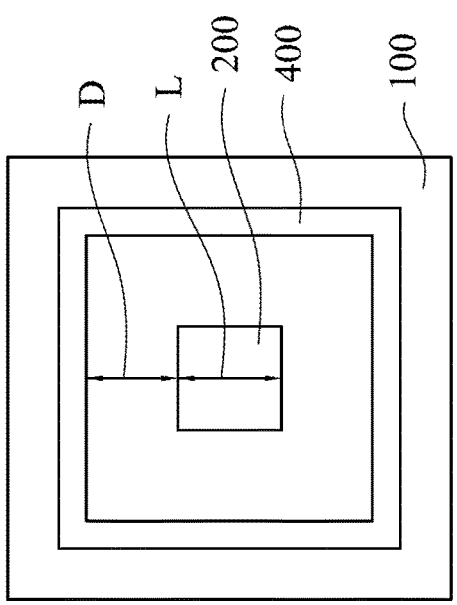
Figure 2E:
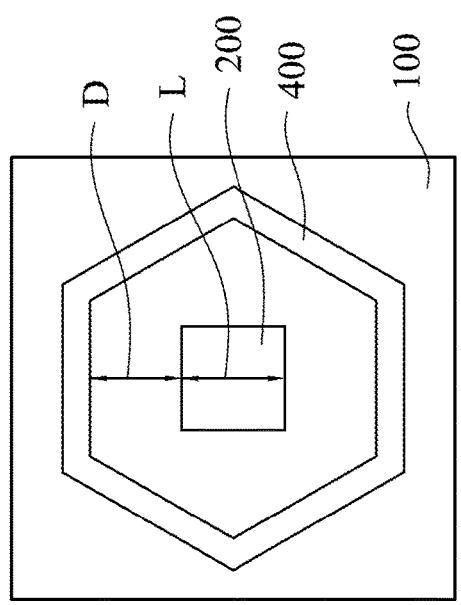

Although in FIG. 2B the plan view of the blocking structure 400 is rectangular, it should be understood that the blocking structure 400 can be any shape. For example, the profile of the blocking structure 400 in a plan view can be a circle (as shown in FIG. 2C), or polygons such as for example a hexagon (as shown in FIG. 2D), or a star (as shown in FIG. 2E).

It is noted that, in some embodiments, the blocking structure 400 may comprise a material having an effect of reflecting the deep ultraviolet light. For example, in some embodiments, the blocking structure 400 includes aluminum, gold, silver, tantalum, or a combination thereof. Accordingly, the blocking structure 400 can increase the light extracting efficiency of the device.

Figure 3:
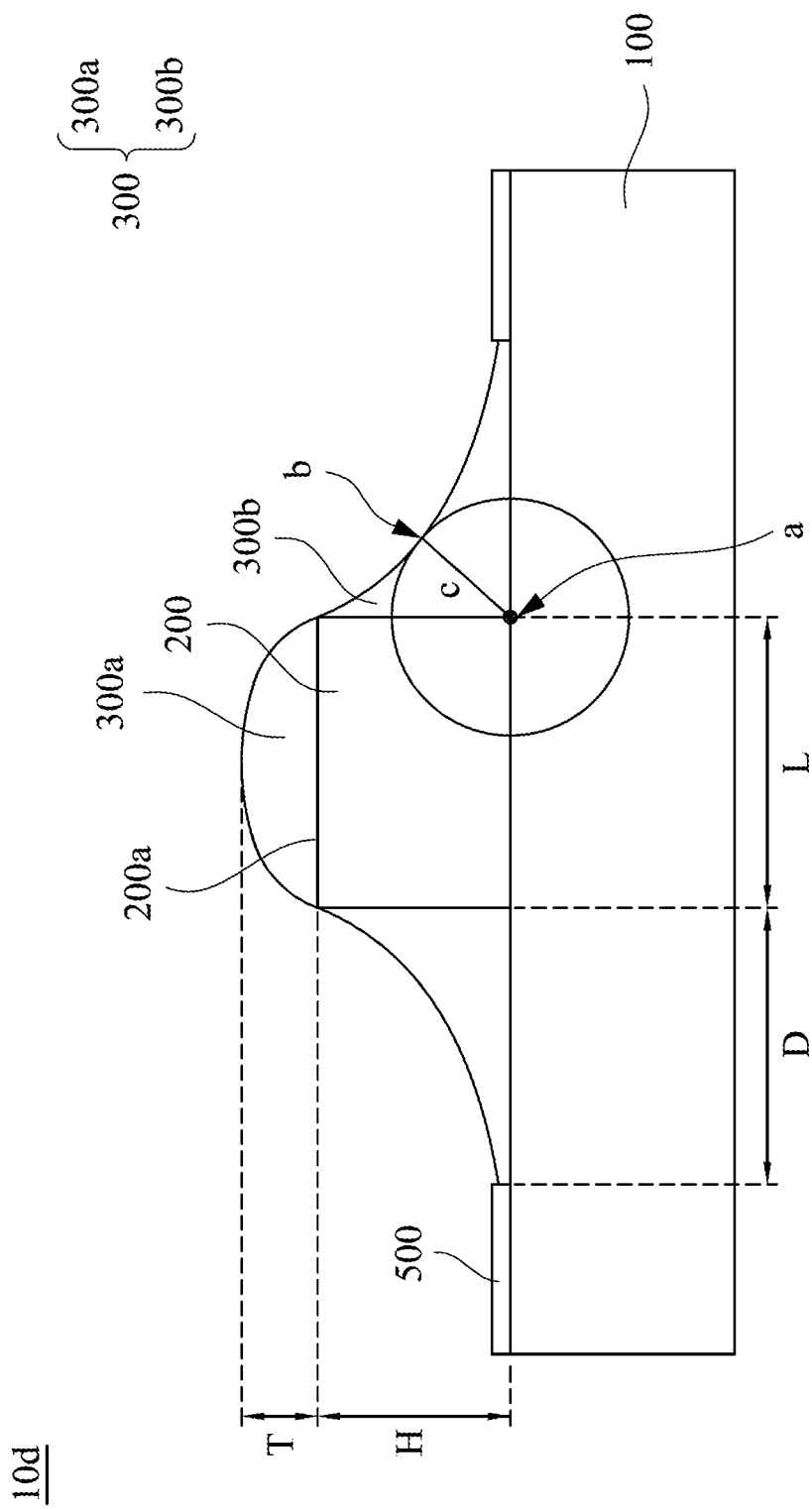
FIG. 3 is a cross-sectional view schematically illustrating a light-emitting device in accordance with some embodiments of the present disclosure.

Reference is made to FIG. 3. FIG. 3 is a cross-sectional view showing a light-emitting device 10d in accordance with some embodiments of the present disclosure. It is noted that, in FIG. 3, the same or similar elements as those in FIG. 1 are given the same reference numerals, and the description thereof will be omitted. The light-emitting device 10d of FIG. 3 is similar to the light-emitting device 10a of FIG. 1, and the difference there between is in that the light-emitting device 10d further includes a glue-phobic layer 500 (the term "glue-phobic" means "lacking an affinity for glue"). The glue-phobic layer 500 is disposed on the panel substrate 100 and is spaced apart from the light-emitting chip 200 by a distance D. Specifically, in order to prevent the formed light extracting layer 300 from occupying an excessively large area of the panel substrate 100 and affecting subsequent operations (such as test operations), the glue-phobic layer 500 is formed surrounding the light-emitting chip 200. The glue-phobic layer 500 is characterized in that the material of the light extracting layer 300 is not liable to be adhered thereto, so that the formed light extracting layer 300 can be positioned in the area surrounded by the glue-phobic layer 500 after the spraying process.

In some embodiments, the distance D is greater than the length L of the light-emitting chip 200. In some embodiments, the glue-phobic layer 500 includes polytetrafluoroethylene, but is not limited thereto. Further, the shape of the glue-phobic layer 500 may be similar to the blocking structures 400 shown in FIGS. 2B-2E. Specifically, the glue-phobic layer 500 can surround the light-emitting chip 200 and define an area for the formation of the light extracting layer 300. The profile of this area in a plan view may be a rectangle, a circle, or other polygons (for example, hexagons or stars).

In view of the embodiments of the present disclosure described hereinbefore, the light-emitting device disclosed herein includes a light extracting layer having a very thin thickness, and that provides excellent light-emitting efficiency and lifetime duration for the light-emitting device. The light extracting layer may be doped with the viscosity-adjusting particles. When the light extracting layer is formed, the material is more likely to adhere to the upper surface and the sidewall of the light-emitting device to form a thinner light extracting layer. In addition, the light-emitting device may further comprise a blocking structure or a glue-phobic layer, such that the formed light extracting layer is positioned in the area surrounded by the blocking structure or the glue-phobic layer. Therefore, subsequent operations are not unfavorably affected. Furthermore, the blocking structure can be formed of a material having an effect of reflecting deep ultraviolet light for improving the light extracting efficiency of the light-emitting device.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A light-emitting device, comprising:
a panel substrate;
a light-emitting chip disposed on the panel substrate; and
a light extracting layer covering the light-emitting chip and the panel substrate, and the light extracting layer has a side portion, wherein an upper surface of the light extracting layer is in direct contact with an air, wherein the side portion of the light extracting layer extends outward from an edge of the light-emitting chip along a surface of the panel substrate, and the side portion gradually decreases in thickness outwards;
wherein taking a position where the edge of the light-emitting chip is in contact with the panel substrate as an origin, the side portion and the origin define a circle tangential to a surface of the side portion, the circle has a radius c that satisfies following formula (1):

$$\frac{1}{40}H \le c \le H; \tag{1}$$

where H is a height of the light-emitting chip.

2. The light-emitting device of claim 1, wherein the light extracting layer has an intermediate portion, and an upper surface of the light-emitting chip and an upper surface of the intermediate portion define a thickness of 10 to 200 μm.

3. The light-emitting device of claim 1, wherein the light extracting layer has an absorption coefficient of 0.3 to 0.00436 $cm^{-1}$ for light having a wavelength of 280 nm.

4. The light-emitting device of claim 1, wherein the light extracting layer is doped with a plurality of viscosity-adjusting particles, and the viscosity-adjusting particles includes ceramic, metal, glass, silicone, tetrafluoroethylene-perfluoropropene copolymer (PFA) or poly tetrafluoroethylene (PTFE).

5. The light-emitting device of claim 1, further comprising:
    a blocking structure disposed on the panel substrate, wherein the blocking structure is spaced from the light-emitting chip by a distance, and the distance is greater than a length of the light-emitting chip.

6. The light-emitting device of claim 5, wherein the blocking structure has a height, and the height of the blocking structure is ¼ to 1 fold of the height of the light-emitting chip.

7. The light-emitting device of claim 5, wherein the blocking structure comprises metal, ceramic or plastic.

8. The light-emitting device of claim 5, wherein the blocking structure comprises aluminum, gold, silver, silicon, or a combination thereof.

9. The light-emitting device of claim 5, wherein the blocking structure has a profile of a circle or a polygon in a plan view.

10. The light-emitting device of claim 1, further comprising:
    a glue-phobic layer disposed on the panel substrate, wherein the glue-phobic layer is spaced from the light-emitting chip by a distance, and the distance is greater than a length of the light-emitting chip.

11. The light-emitting device of claim 10, wherein the glue-phobic layer comprises polytetrafluoroethylene.

* * * * *